United States Patent
Baenisch et al.

(10) Patent No.: US 6,724,667 B2
(45) Date of Patent: Apr. 20, 2004

(54) DATA MEMORY WITH REDUNDANT MEMORY CELLS USED FOR BUFFERING A SUPPLY VOLTAGE

(75) Inventors: Andreas Baenisch, Munich (DE); Sabine Kling, Munich (DE)

(73) Assignee: Infineon Technologies AG, Munich (DE)

(*) Notice: Subject to any disclaimer, the term of this patent is extended or adjusted under 35 U.S.C. 154(b) by 38 days.

(21) Appl. No.: 10/134,670

(22) Filed: Apr. 29, 2002

(65) Prior Publication Data
US 2002/0172083 A1 Nov. 21, 2002

(30) Foreign Application Priority Data
Apr. 30, 2001 (DE) .......................... 101 21 131

(51) Int. Cl.[7] ................ G11C 7/00; G11C 11/24; G11C 7/02
(52) U.S. Cl. .............. 365/200; 365/149; 365/206; 365/214
(58) Field of Search ................. 365/200, 149, 365/206, 214

(56) References Cited
U.S. PATENT DOCUMENTS

| | | | | |
|---|---|---|---|---|
| 4,908,798 A | * | 3/1990 | Urai | 365/185.09 |
| 5,706,231 A | * | 1/1998 | Kokubo | 365/200 |
| 5,936,970 A | * | 8/1999 | Lee | 714/710 |
| 6,144,592 A | | 11/2000 | Kanda | 365/200 |
| 6,288,944 B1 | * | 9/2001 | Kawamura | 365/185.22 |
| 6,292,383 B1 | * | 9/2001 | Worley | 365/69 |
| 2002/0004923 A1 | * | 1/2002 | Haraguchi | 714/736 |

FOREIGN PATENT DOCUMENTS

DE   3688338 T2   3/1993   ............ H04H/5/00

* cited by examiner

Primary Examiner—David Nelms
Assistant Examiner—Ly Duy Pham
(74) Attorney, Agent, or Firm—Withrow & Terranova, PLLC

(57) ABSTRACT

A data memory for storing data, having a memory cell array (2), which comprises a large number of memory cells (3), each of which can be addressed by means of a memory cell select transistor (4) connected to a word line (9) and to a bit line (13) and which have a storage capacity for storing one data bit, the memory cell array (2) containing redundant memory cells (3'), which are provided in order to replace memory cells (3) which have been produced wrongly, by means of readdressing, and having read amplifiers (22), which are in each case provided for the signal amplification of a data bit read from an addressed memory cell (3) via an associated bit line (13) and are supplied with a buffered supply voltage, the redundant memory cells (3') which have not been readdressed being connected to the associated bit lines (13') and additionally buffering the supply voltage for the read amplifiers (22).

20 Claims, 2 Drawing Sheets

DATA MEMORY WITH REDUNDANT MEMORY CELLS USED FOR BUFFERING A SUPPLY VOLTAGE

This application claims the benefit of German patent application DE10113458.4, currently pending, which is incorporated herein by reference in its entirety.

FIELD OF THE INVENTION

The invention relates to a data memory for storing data, in which the supply voltage lines are additionally buffered by the storage capacities of redundant memory cells.

BACKGROUND OF THE INVENTION

FIG. 1 shows, schematically, a data memory for storing in accordance with the prior art. The data memory has a memory cell array having a large number of memory cells. In this case, each memory cell comprises a select transistor and a storage capacity for storing one data bit. The memory cells are addressed via the select transistors, which are connected via word lines and bit lines to address decoders. The memory cell array contains redundant memory cells $SZ_{RED}$, which are provided in order to replace memory cells which have been produced wrongly in the production process The redundant memory cells are driven by the address decoders via associated word lines $WL_{RED}$ and bit lines $BL_{RED}$. The address decoders are connected to fuse-blocks, as they are known, or readdressing lines, which map or readdress the addresses of memory cells that have been produced wrongly to addresses of redundant memory cells. The memory cell array produced is subjected to a testing operation following the production process and the fuse-blocks are programmed in such a way that the addresses of the memory cells produced wrongly are remapped to the redundant memory cells $SZ_{RED}$. The fuse-blocks or readdressing circuits contain fuses or fuse links such as laser fuses or electric fuses. The fuses comprise metal strips, for example, which are severed for the purpose of readdressing. To this end, the fuse-blocks are programmed via programming lines P. The fuse-blocks or readdressing circuits are connected to the internal address bus of the data memory. The memory cell array contains read amplifiers to read the data bits stored in the memory cells. Here, the read amplifiers comprise operational amplifiers, which amplify the voltage difference between a bit line and a reference potential and output it at a data output. The data D read out is output via a data bus for further processing. The read amplifiers within the memory cell array are connected, via internal voltage supply lines within the memory cell array, to a supply voltage terminal, which is connected via an external supply voltage line to the output of a supply voltage source VQ. The externally applied supply voltage is buffered by a buffer capacitor with a high capacitance in order to balance out the voltage fluctuations.

One disadvantage of the data memory according to the prior art, illustrated in FIG. 1, is that the external supply voltage line between the output of the external supply voltage source VQ and the supply voltage terminal $V_{SS}$ of the memory cell array is relatively long. Because of the relatively high line length, the resistance R of the external supply voltage line is relatively high. Because of the high storage capacity of the supply voltage buffer capacitor $C_P$, the time constant τ which results from the product of the line resistance R of the external supply voltage line and the capacitance of the buffer capacitor $C_P$ is high. The buffering of the supply voltage for these amplifiers within the memory cell array is therefore relatively sluggish, so that the electric charge needed for the loads contained in the memory cell array cannot be supplied quickly enough by the buffered supply voltage. Because of the sluggishness of the buffered supply voltage, voltage peaks or local brief voltage dips on the supply voltage lines for the read amplifiers cannot be compensated for quickly enough, so that it is possible for read errors to occur when reading the stored data bits.

It is therefore the object of the present invention to provide a data memory for storing data whose supply voltage is buffered with a low sluggishness.

According to the invention, this object is achieved by the data memory having the features specified in patent claim 1.

SUMMARY OF THE INVENTION

The invention provides a data memory for storing data having
a memory cell array, which comprises a large number of memory cells, each of which can be addressed by means of a memory cell select transistor connected to a word line and to a bit line and which have a storage capacity for storing one data bit,
the memory cell array containing redundant memory cells, which are provided in order to replace memory cells which have been produced wrongly, by means of readdressing, and having
read amplifiers, which are in each case provided for the signal amplification of a data bit read from an addressed memory cell via an associated bit line and are supplied with a buffered supply voltage,
the excess redundant memory cells which have not been readdressed being connected to the associated bit lines and additionally buffering the supply voltage for the read amplifiers.

In the case of the data memory according to the invention, the capacities of the excess redundant memory cells which are not needed to repair the memory cells that have been produced wrongly are used for the additional buffering of the supply voltage lines for the read amplifiers. The word lines of the data memory according to the invention are preferably connected to a word line decoder, and the bit lines are preferably connected to an associated bit line decoder.

In a preferred embodiment of the data memory according to the invention, the word line decoder and the bit line decoder are in each case connected to a readdressing circuit, which remap the addresses of memory cells that have been produced wrongly to the addresses of redundant memory cells within the memory cell array.

The word lines of the excess redundant memory cells that have not been readdressed are connected to a voltage potential in order to turn on the associated select transistors of the memory cells.

The bit lines of the excess redundant memory cells that have not been readdressed are preferably connected to the buffered supply voltage.

Each memory cell of the memory cell array preferably has a storage capacitor with a storage capacity for storing one data bit.

The supply voltage for the read amplifiers is preferably generated by an external voltage supply source and output at an output of the supply voltage source, a buffer capacitor with a high capacitance being connected between the output of the supply voltage source and a reference potential in order to buffer the supply voltage.

In a particularly preferred embodiment of the data memory according to the invention, the bit lines of the redundant memory cells are connected to gate terminals of field effect transistors, which are connected to internal supply voltage lines for the read amplifiers of the non-redundant memory cells.

The supply voltage buffered by the buffer capacitor is preferably connected via an external supply voltage line to the read amplifiers in order to supply them with voltage.

In this case, the line lengths of the bit lines between the memory cells and the read amplifiers are preferably significantly shorter than the line length of the external supply voltage line.

In a particularly preferred embodiment of the data memory according to the invention, the redundant memory cells within the memory cell array are arranged close to the read amplifiers.

The data memory is preferably a DRAM memory.

In the further text, a preferred embodiment of the data memory according to the invention will be described in order to explain features essential to the invention.

BRIEF DESCRIPTION OF THE DRAWING FIGURES

DETAILED DESCRIPTION OF THE PREFERRED EMBODIMENTS

Figure 1:
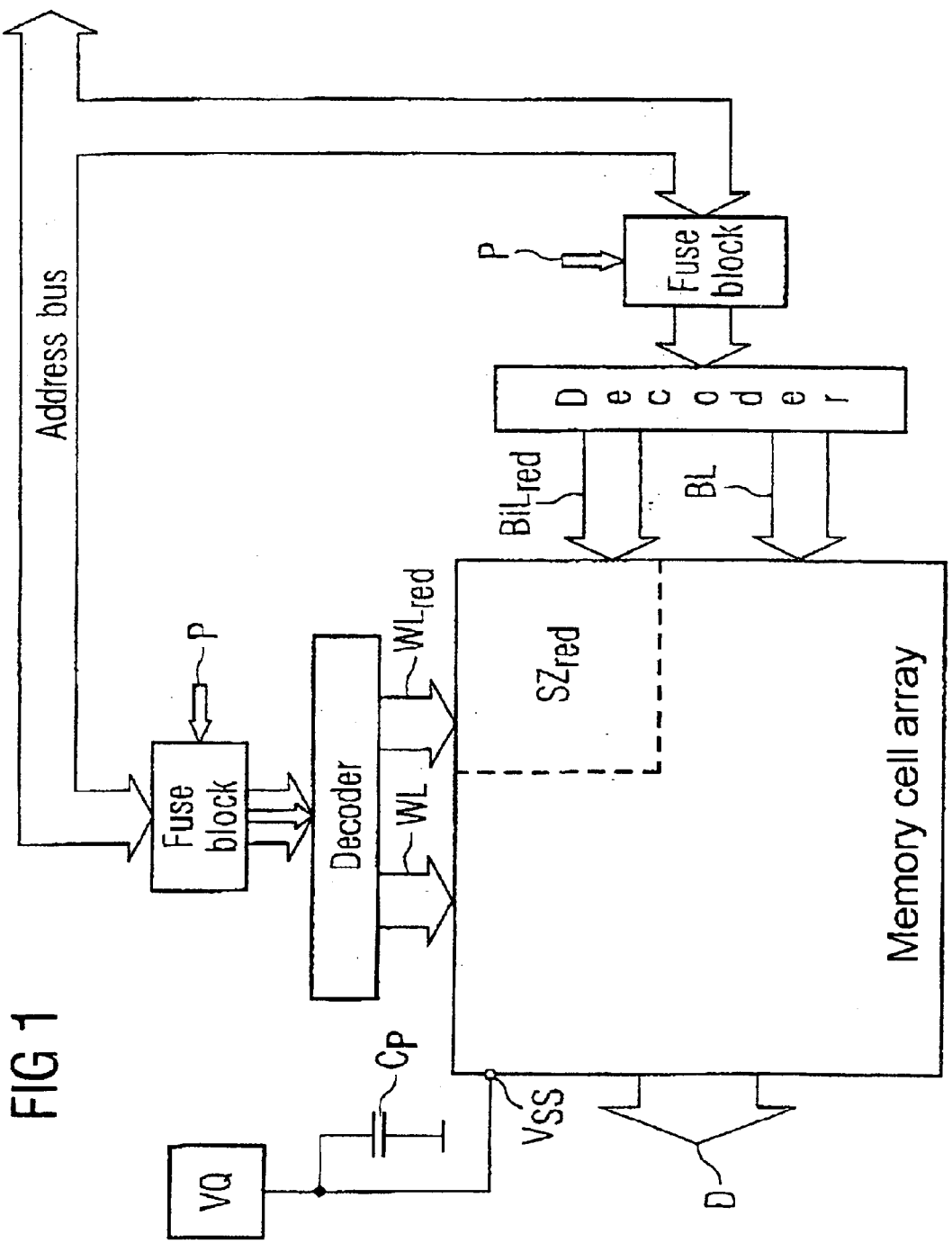
FIG. 1 shows a data memory according to the prior art

The data memory 1 according to the invention has a memory cell array 2 with a large number of memory cells 3 contained therein. In this case, the memory cell array 2 contains both conventional memory cells 3 and, additionally, redundant memory cells 3', which are provided in order to replace memory cells 3 that have been produced wrongly, by means of readdressing. Each memory cell contains a select transistor 4 and a storage capacitor 5. In the embodiment illustrated in FIG. 2, the select transistor 4 comprises an NMOS field effect transistor, whose gate terminal 6 is connected via a connecting line 7 to a word line 9 at a junction 8. A terminal 10 of the select transistor 4 is connected via a connecting line 11 to an associated bit line 13 at a connecting junction 12. The word lines 9 and the bit lines 13 run in the manner of a matrix in the memory cell array. Here, the word lines 9 are connected to an address decoder 14 and the bit lines 13 are connected to an address decoder 15.

The word line address decoder 14 is connected to a programmable readdressing circuit 16, and the bit line decoder 15 is connected to a readdressing circuit 17. The two readdressing circuits 16, 17 can be programmed via programming lines 18, 19. The readdressing circuits 16, 17 are also connected to an address bus 20 of the data memory 1. The readdressing circuits 16, 17 remap the addresses of memory cells 3 that have been produced wrongly to addresses of redundant memory cells 3'. To this end, the memory cell array 2 is subjected to a testing operation and the addresses of the memory cells that have been produced wrongly are determined. The readdressing circuits 16, 17 are then programmed, via the programming lines 18, 19, in such a way that the addresses of the memory cells that have been produced wrongly are remapped to the addresses of redundant memory cells 3'. In this case, the number of redundant memory cells 3' present in the memory cell array 2 exceeds by far the number of necessary redundant memory cells which are actually needed to replace memory cells 3 that have been produced wrongly, in an average production process. Therefore, after the remapping operation, the memory cell array 2 still contains a considerable number of excess, non-redundant memory cells 3', which were not needed to repair defective memory cells.

The bit lines 13 are connected to an input 21 of a differential amplifier 22. The differential amplifier 22 is sometimes referred to herein as a read amplifier 22 and has a further input 23, which is connected via a line 24 to a reference potential or ground. The read amplifiers 22 in each case have an output 25, which is connected via an internal read data line 26 to a data output 27 of the memory cell array 2. The read amplifiers 22 are provided for the signal amplification of the data signals present on the bit lines 13. In this case, the read amplifiers 22 are supplied with voltage via internal supply voltage lines 28, 29 with a supply voltage ($V_{SS}$, $V_{DD}$). The various supply voltage lines 28 of the read amplifiers 22 are connected to a supply voltage terminal 30 of the memory cell array 2. The supply voltage terminal 30 of the memory cell array 2 is connected via an external supply voltage line 31 to an output 32 of a supply voltage source 33. The supply voltage generated by the supply voltage source 33 is buffered by a buffer capacitor 34, which is connected via a line 35 to the output 32 of the supply voltage source 33 and which is connected via a line 36 to a reference potential, for example ground. The buffer capacitor 34 has a relatively high capacitance for buffering the supply voltage. The buffer capacity is in an exemplary embodiment in the range of a few nF.

In the data memory 1 according to the invention, the excess redundant memory cells 3' not needed for the readdressing are connected to the associated bit line 13', so that the storage capacitors 5' contained in the redundant memory cells 3' additionally buffer the supply voltage for the read amplifiers 22. To this end, the word lines 9' of the redundant memory cells 3' are connected or wired by means of a switching device to a voltage potential in order to activate or turn on the associated select transistor 6' of the redundant memory cell 3'. In the embodiment illustrated in FIG. 2, the select transistor 4' of the redundant memory cell 3' is an NMOS field effect transistor, whose gate terminal 6' is connected to a high voltage potential of, for example, 3 V, in order that the storage capacitor 5' contained in the redundant memory cell 3' is switched through to the associated bit line 13'. Furthermore, by means of programming the readdressing circuit 17, the bit lines 13' of the redundant memory cells 3' are connected to a line 37, so that the high voltage potential output by the voltage source 33 is present on the bit line 13. As a result of the high voltage potential on the bit line 13', the gate terminal 38 of an NMOS field effect transistor 39 is pulled up to a high voltage potential, so that the NMOS field effect transistor 39 turns on and connects the bit line 13' of the redundant memory cell 3' via a line 40 to the supply voltage line 28 for the read amplifiers 22 of the non-redundant memory cells 3. The redundant memory cells 3' are connected via associated bit lines 13' and the turned-on NMOS field effect transistors 40, and also via internal lines 40 and internal supply voltage lines 28, to the supply voltage terminal of the read amplifiers 22. The capacitor 5' contained in the memory cell 3' therefore additionally buffers the supply voltage of the read amplifier 22.

In the memory cell array 2 there are a very large number of memory cells, for example $2^{27}$, a certain percentage of the memory cells being formed by redundant memory cells. Here, a memory cell array contains a few million redundant memory cells. The capacitance of the storage capacitor 5' within a redundant memory cell 3' is, for example, $30 \times 10^{-15}$ F. If, for example, of the original 5 million redundant memory cells, only 4 million memory cells are needed for the repair of defective memory cells, 1 million redundant memory cells are left over, and are ready to improve the buffering of the supply voltage for the read amplifiers. By means of these excess redundant memory cells, an additional buffer capacitance of about 30 nF can be made available for buffering the supply voltage of the read amplifiers.

Figure 2:
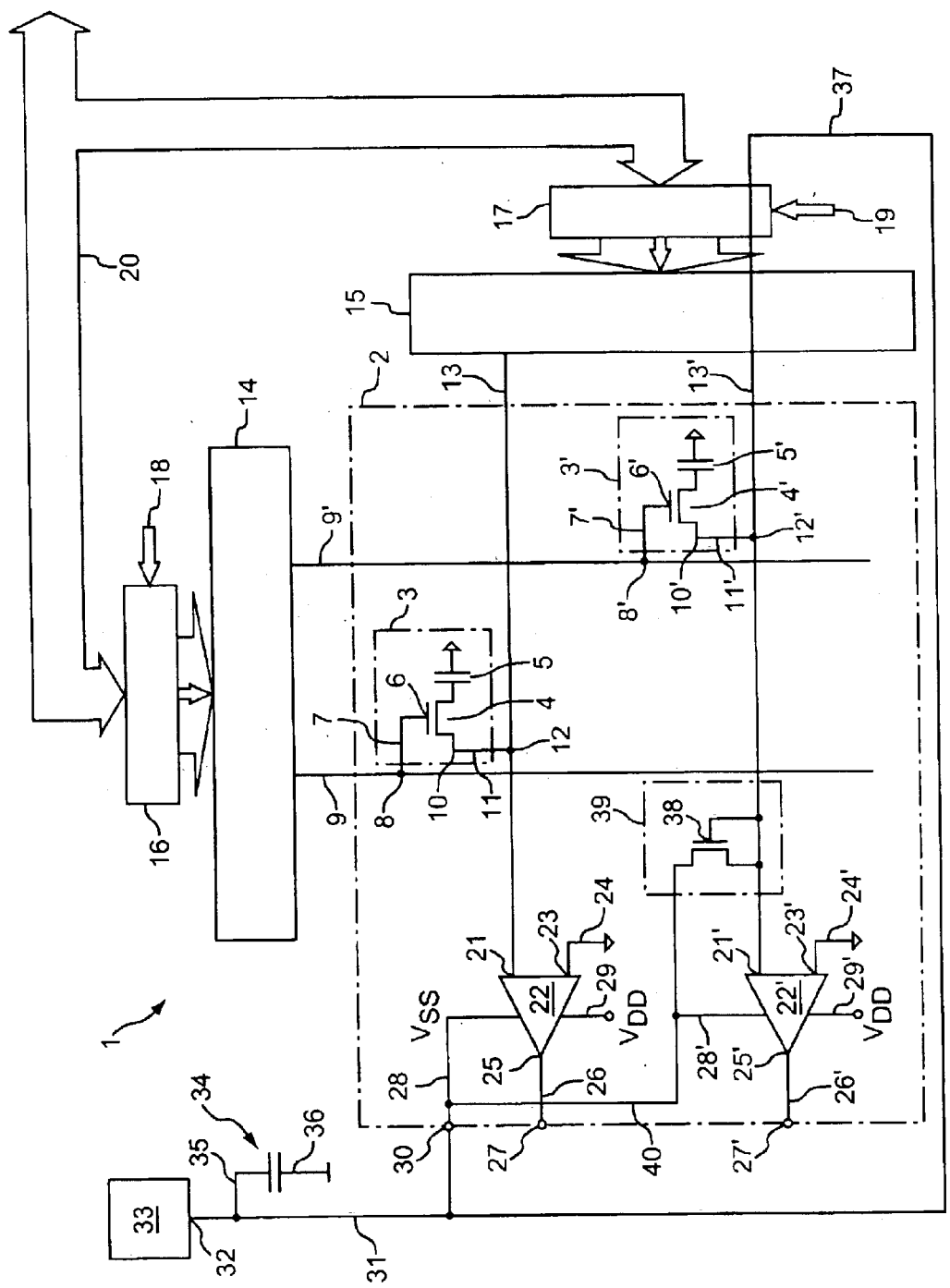
FIG. 2 shows a preferred embodiment of a data memory according to the invention.

The line lengths of the lines illustrated in FIG. 2 are not true to scale. The line lengths of the bit line 13' within the memory cell array 2 between the redundant memory cells 3' and the inputs 21 of the read amplifiers are substantially shorter than the line lengths of the external supply voltage line 31. Because of the short line lengths, the resistance of the line between the redundant memory cell 3' and the supply voltage terminal 28 to be buffered of the read amplifier 22 is low, so that the time constant for charging and discharging the storage capacitor 5' within the redundant memory cell 3' is also low. By means of the connected storage capacitors 5', it is therefore possible for voltage peaks or short local voltage dips on the supply lines 28 for the read amplifiers 22 to be compensated for very quickly. The read amplifiers 22 therefore operate with high operational reliability, so that errors when reading data from the memory cell array 2, on account of brief supply voltage fluctuations, do not occur. The supply voltages of the read amplifiers are therefore buffered locally and quickly by the capacitors 5' of the excess redundant memory cells 3'.

The data memory array 2 is preferably laid out in such a way that the redundant memory cells 3' are located physically close to the signal inputs of the read amplifier 22. This results in the time constant for charging and discharging the storage capacitors 5' to compensate for charge fluctuations on the supply voltage lines 28 for the read amplifiers 22 being particularly low.

What is claimed is:

1. A data memory for storing data, comprising:
   a) a memory cell array, which comprises a large number of memory cells, each of which can be addressed by means of a memory cell select transistor connected to a word line and to a bit line and which have a storage capacity for storing one data bit,
   b) the memory cell array containing redundant memory cells, which are provided in order to replace memory cells which have been produced wrongly, by means of readdressing, and having
   c) read amplifiers, which are in each case provided for the signal amplification of a data bit read from an addressed memory cell via an associated bit line and are supplied with a buffered supply voltage,
   d) select transistors of the redundant memory cells which have not been readdressed being turned on in order that storage capacity of the redundant memory cells is connected to the associated bit lines for additionally buffering the supply voltage for the read amplifiers.

2. The data memory as claimed in claim 1, wherein the word lines are connected to a word line decoder and the bit line is connected to a bit line decoder.

3. The data memory as claimed in claim 1, wherein the word line decoder and the bit line decoder are connected to readdressing circuits, said readdressing circuits performing readdressing to map addresses of memory cells that have been wrongly produced to addresses of redundant memory cells.

4. The data memory as claimed in claim 1, wherein the word lines of the redundant memory cells that have not been readdressed are connected to a voltage potential in order to turn on the associated select transistors within the redundant memory cells.

5. The data memory as claimed in claim 1, wherein the bit lines of the redundant memory cells that have not been readdressed are connected to the buffered supply voltage for the read amplifiers.

6. The data memory as claimed in claim 1, wherein each memory cell of the memory cell array has a capacitor with a storage capacity for storing one data bit.

7. The data memory as claimed in claim 1, wherein the supply voltage for the read amplifiers is generated by a supply voltage source and is output at an output of the supply voltage source, a buffer capacitor with a high capacitance for buffering the supply voltage in order to balance out voltage fluctuations, the buffer capacitor being connected between the output of the supply voltage source and a reference potential.

8. The data memory as claimed in claim 1, wherein the bit lines of the redundant memory cells are connected to gate terminals of field effect transistors, which connect the bit lines of the redundant memory cells to the supply voltage lines for the read amplifiers of the non-redundant memory cells.

9. The data memory as claimed in claim 7, wherein the supply voltage buffered by the buffer capacitor is applied, via at least one external supply voltage line, to the read amplifiers in order to supply their voltage.

10. The data memory as claimed in claim 1, wherein the line lengths of the bit lines between the memory cells and the read amplifiers are shorter than the line lengths of the external supply voltage line.

11. The data memory as claimed in claim 1, wherein the redundant memory cells in the memory cell array are arranged closed to the read amplifiers.

12. The data memory as claimed in claim 1, wherein the data memory is a DRAM memory.

13. The data memory as claimed in claim 2 wherein the word line decoder and the bit line decoder are connected to readdressing circuits, said readdressing circuits performing readdressing to map addresses of memory cells that have been wrongly produced to addresses of redundant memory cells.

14. The data memory of claim 2 wherein the word lines of the redundant memory cells that have not been readdressed are connected to a voltage potential in order to turn on associated select transistors.

15. The data memory of claim 3 wherein the word lines of the redundant memory cells that have not been readdressed are connected to a voltage potential in order to turn on associated select transistors.

16. The data memory of claim 13 wherein the word lines of the redundant memory cells that have not been readdressed are connected to a voltage potential in order to turn on associated select transistors.

17. The data memory of claim 2 wherein the bit lines of the redundant memory cells that have not been readdressed are connected to the buffered supply voltage for the read amplifiers.

18. The data memory of claim 3 wherein the bit lines of the redundant memory cells that have not been readdressed are connected to the buffered supply voltage for the read amplifiers.

19. The data memory of claim 4 wherein the bit lines of the redundant memory cells that have not been readdressed are connected to the buffered supply voltage for the read amplifiers.

20. The data memory of claim 13 wherein the bit lines of the redundant memory cells that have not been readdressed are connected to the buffered supply voltage for the read amplifiers.

* * * * *

UNITED STATES PATENT AND TRADEMARK OFFICE
CERTIFICATE OF CORRECTION

PATENT NO.   : 6,724,667 B2
DATED        : April 20, 2004
INVENTOR(S)  : Baenisch et al.

It is certified that error appears in the above-identified patent and that said Letters Patent is hereby corrected as shown below:

<u>Column 1,</u>
Line 6, please replace "DE10113458.4" with -- DE 101 21 131.7 --.

Signed and Sealed this

Twelfth Day of April, 2005

JON W. DUDAS
*Director of the United States Patent and Trademark Office*